(12) United States Patent
Semeniuk et al.

(10) Patent No.: US 10,163,970 B2
(45) Date of Patent: Dec. 25, 2018

(54) AMORPHOUS LEAD OXIDE BASED ENERGY DETECTION DEVICES AND METHODS OF MANUFACTURE THEREOF

(71) Applicant: THUNDER BAY REGIONAL HEALTH RESEARCH INSTITUTE, Thunder Bay (CA)

(72) Inventors: Oleksii Semeniuk, Thunder Bay (CA); Alla Reznik, Shuniah (CA); Vlad Sukhovatkin, Mississauga (CA)

(73) Assignee: THUNDER BAY REGIONAL HEALTH RESEARCH INSTITUTE, Thunder Bay, ON (CA)

( * ) Notice: Subject to any disclaimer, the term of this patent is extended or adjusted under 35 U.S.C. 154(b) by 0 days.

(21) Appl. No.: 15/427,247

(22) Filed: Feb. 8, 2017

(65) Prior Publication Data

US 2017/0229511 A1 Aug. 10, 2017

Related U.S. Application Data

(60) Provisional application No. 62/292,478, filed on Feb. 8, 2016.

(51) Int. Cl.
*C23C 14/08* (2006.01)
*C23C 14/28* (2006.01)
(Continued)

(52) U.S. Cl.
CPC .... *H01L 27/14676* (2013.01); *C23C 14/0031* (2013.01); *C23C 14/08* (2013.01);
(Continued)

(58) Field of Classification Search
None
See application file for complete search history.

(56) References Cited

U.S. PATENT DOCUMENTS 3,372,056 A * 3/1968 De Haan ............. C23C 14/0021
257/E21.069
3,444,412 A * 5/1969 De Haan ............. C23C 14/0021
257/43
(Continued)

FOREIGN PATENT DOCUMENTS

GB 1070621 A * 3/1964 ......... C23C 14/0021

OTHER PUBLICATIONS

Bunshah et al.(Bunshah editor); Deposition Technologies for Film and Coatings the; Developments and Applications;Materials Science Series; Noyes Publications; Park Bridge, New Jersey, USA; 1982 (no month); excerpt pp. 18-53 & 244-269.*
(Continued)

*Primary Examiner* — Marianne L Padgett
(74) *Attorney, Agent, or Firm* — Hill & Schmacher

(57) ABSTRACT

PbO-based photoconductive X-ray imaging devices are disclosed in which the PbO photoconductive layer exhibits an amorphous crystal structure. According to selected embodiments, the amorphous PbO photoconductive layer may be formed by providing a substrate inside an evacuated evaporation chamber and evaporating lead oxide to deposit a photoconductive lead oxide layer onto the substrate, while subjecting the photoconductive layer to ion bombardment with oxygen ions having an ion energy between 25 and 100 eV. X-ray direct detection imaging devices formed from such amorphous PbO photoconductive layers are shown to exhibit image lag that is suitable for fluoroscopic imaging.

18 Claims, 12 Drawing Sheets

(51) Int. Cl.
*H01L 27/146* (2006.01)
*C23C 14/00* (2006.01)
*C23C 14/22* (2006.01)
*C23C 14/24* (2006.01)
*H01L 31/032* (2006.01)
*H01L 31/0376* (2006.01)
*H01L 31/08* (2006.01)

(52) U.S. Cl.
CPC .......... *C23C 14/088* (2013.01); *C23C 14/221* (2013.01); *C23C 14/243* (2013.01); *C23C 14/28* (2013.01); *H01L 27/14692* (2013.01); *H01L 27/14698* (2013.01); *H01L 31/032* (2013.01); *H01L 31/0324* (2013.01); *H01L 31/0376* (2013.01); *H01L 31/085* (2013.01)

(56) References Cited

U.S. PATENT DOCUMENTS

| | | | | |
|---|---|---|---|---|
| 4,099,969 | A * | 7/1978 | Leder | G03G 5/082 204/164 |
| 4,173,497 | A | 11/1979 | Schmidt et al. | |
| 4,307,319 | A * | 12/1981 | Terao | H01J 29/451 313/386 |
| 4,636,806 | A | 1/1987 | Watarai et al. | |
| 5,233,265 | A * | 8/1993 | Takasaki | H01J 29/456 257/E31.049 |
| 5,396,072 | A * | 3/1995 | Schiebel | H01L 27/14659 250/370.09 |
| 5,729,021 | A | 3/1998 | Brauers et al. | |
| 5,863,869 | A * | 1/1999 | Chaudhari | H01L 39/126 427/62 |
| 6,509,066 | B1 * | 1/2003 | Jost | C23C 14/0623 257/E31.029 |
| 7,649,179 | B2 | 1/2010 | Simon et al. | |
| 9,985,139 | B2 * | 5/2018 | Nomura | H01L 29/66969 |
| 2003/0048745 | A1 * | 3/2003 | Yoshikawa | B82Y 10/00 369/292 |
| 2007/0252129 | A1 * | 11/2007 | Yagi | H01L 31/032 257/2 |
| 2008/0156995 | A1 | 7/2008 | Simon et al. | |
| 2013/0042910 | A1 | 2/2013 | Watt | |
| 2013/0221241 | A1 | 8/2013 | Rowlands | |
| 2015/0014627 | A1 * | 1/2015 | Yu | H01L 27/14665 257/13 |
| 2016/0133751 | A1 * | 5/2016 | Nomura | H01L 29/66969 345/520 |
| 2016/0161426 | A1 * | 6/2016 | Wober | G01N 23/046 378/19 |

OTHER PUBLICATIONS

International Search Report From Related Application PCT/CA2017/050136, dated Jun. 1, 2017, 3 Pages.
Written Opinion of Related Application PCT/CA2017/050136, dated Jun. 1, 2017, 4 Pages.
Anders, A., Thin Solid Films 518 (2010) 4087-4090, "A structure zone diagram including plasma-based deposition and ion etching", online Oct. 29, 2009.
Simon, M. et al., IEEE Transactions on Nuclear Science, 52 (2005), 2035, Analysis Lead Oxide (PbO) Layers for Direct Conversion of X-Ray Detection, vol. 52, No. 5; Oct. 2005; pp. 2035-2040.
Berashevich, J. et al., J. Phys. Cond. Matt. 25 (2013), 075803, Dec. 14, 2012; 7 pages "Lead monoxide a-PbO: electronic properties and point defect formation".
Frit, A. et al., Int. J. ChemTech Res. 6 (2014) 5347-5352, "The Effect of Annealing Time on Lead Oxide Thin Films Coated on Indium Tin Oxide Substrate", vol. 6, No. 13; Nov. 2014.
Reznik, A. et al., Lakehead University Web Page, Direct Conversion Fluoroscopy using Lead Oxide Photoconductor for general radiography and fluoroscopy, Screen Capture from Apr. 27, 2014.
Semeniuk, O., Lead Oxide (PbO) for direct conversion fluoroscopic detectors, Masters Thesis, Lakehead University, 2012.

* cited by examiner

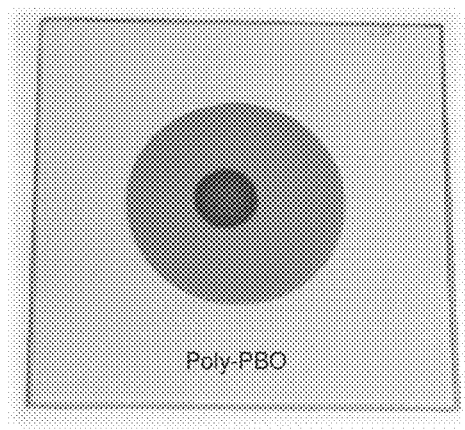 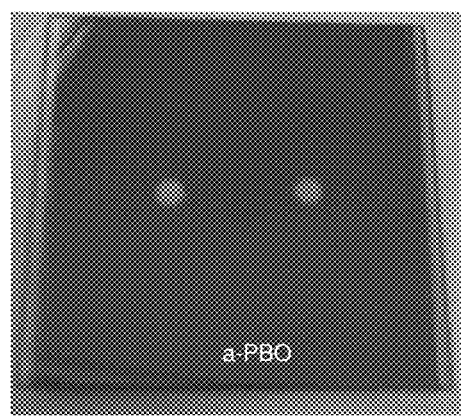
FIG. 9A                    FIG. 9B

AMORPHOUS LEAD OXIDE BASED ENERGY DETECTION DEVICES AND METHODS OF MANUFACTURE THEREOF

CROSS-REFERENCE TO RELATED APPLICATION

This application claims priority to U.S. Provisional Application No. 62/292,478, titled "AMORPHOUS LEAD OXIDE BASED ENERGY DETECTION DEVICES AND METHODS OF MANUFACTURE THEREOF" and filed on Feb. 8, 2016, the entire contents of which is incorporated herein by reference.

BACKGROUND

The present disclosure relates to medical imaging. More particularly, the present disclosure relates to direct detection x-ray imaging devices.

The most common and important application of fluoroscopic x-ray imaging today is in image guided cardiac therapeutic procedures where real-time (30 frame per second) image sequences are used to guide the interventional radiologist's mind and hand. One example is treatment of coronary artery disease (CAD) which results in thickening of the artery wall leading to a narrowing of the lumen and increased risk of thrombus formation. Fluoroscopy-guided catheterization is the method of choice for the investigation and treatment of CAD. The vessels are made visible by the injection of an iodinated radio-opaque contrast agent and images are obtained in real-time.

In 2010, it is estimated that there were over 3 million cardiac catheterization procedures performed in North America using x-ray fluoroscopy. The popularity of such procedures is caused by the fact, that they allow to replace open heart surgeries and thus less invasive. However, although these procedures are a great boon to patient care, they come at a price. First, the interventional cases tend to be longer than diagnostic procedures and can take 1-2 hours. With a typical fluoroscopic patient entrance exposure rate of 3 R/min (30 mGy/min skin dose), the skin dose from such procedures can be of the order of Gy and can approach the level where the patient is subject to somatic effects from a single procedure. In addition, the lifetime risk to the patient of a radiation induced cancer can be substantial, though difficult to calculate for an individual.

In short, there are many procedures currently in use which, for a single diagnostic or treatment session, can increase the probability of death from a subsequent radiation induced cancer by 1 in 200.

In addition to a risk to a patient, there are significant risks to interventional radiologists performing the procedures. While it is difficult to precisely quantify risk of malignancy in physicians using fluoroscopy, the general consensus is that there is an increased risk. Hence, x-ray exposure to patient and medical personnel during fluoroscopic procedures has to be reduced, without sacrificing the image quality.

Flat panel x-ray detectors based on active matrix flat panel imagers (AMFPI) are used in state-of-the-art fluoroscopic systems. Currently, flat panel fluoroscopic systems employ an indirect conversion scheme, in which a CsI scintillator first converts x-ray quanta into optical photons, which in turn diffuse through a phosphor and then are converted back to electrons by an array of photodiodes. This indirect and multi-stage conversion process reduces the conversion gain, while the resolution of the detector degrades as a result of the isotropic light spread that occurs even when the scintillators are structured. The aforementioned problems associated with indirect detection can be addressed by the use of direct conversion detectors, where a photoconductive layer is deposited directly on an AMFPI and acts as x-ray-to-charge transducer. X-rays are absorbed in a photoconductor that directly creates electron hole pairs, which are separated and moved by an electric field and thus there is no significant loss of resolution. By reducing the number of stages, the conversion process can be up to ten times more efficient than for scintillator, making it more efficient at the lowest exposure rates.

Direct detection requires a photoconductive having a distinct set of properties. Four important photoconductor properties for direct x-ray detection are: (1) high conversion gain; (2) good photoconductive properties; (3) high absorption efficiency and (4) compatibility with large area detector technology. Currently, the only commercially viable x-ray photoconductor in direct conversion x-ray detectors is a-Se. Unfortunately, a-Se is a low-Z (atomic number) material and thus has adequate absorption only at low x-ray energies and the high exposures (i.e. exposures suitable for digital mammography), while at the lowest fluoroscopic doses, a-Se direct conversion FPDs have similar conversion efficiency as CsI indirect detectors. In order to achieve suitable imaging performance for low-dose fluoroscopic procedures, a-Se has to be replaced with a high-Z material that has high absorption and also possesses lower electron-hole pair creation energy, and therefore a higher conversion gain.

Polycrystalline lead oxide (PbO) satisfies all criteria since:

(1) It has a theoretically predicted high conversion gain;

(2) Its appropriate photoconductive properties have been proven by applications in Plumbicon video pick-up tubes; and (3) It has a higher X-ray detection quantum efficiency due to its high Z.

Hence, a flat panel direct conversion detector based on PbO technology would appear to possess the features needed to meet the requirements of fluoroscopic cardiac interventional procedures. Polycrystalline PbO was previously shown to have many of the requirements for an effective photoconductive material and additionally it has been previous used in small area imaging systems (Plumbicons). This indicates an adequate temporal response when used in thin layers, while a thicker layer and larger coated area are needed for medical imaging applications.

In 2005 Simon et al. demonstrated a complete large area flat panel imager, indicating that the PbO deposition process is compatible with a-Si electronics and allows large detector area coating (M. Simon, R. A. Ford, A. R. Franklin, S. P. Grabowski, B. Menser, A. Nascetti, M. Overdick, M. J. Powell, D. U. Wiechert, "Analysis of Lead Oxide (PbO) Layers for Direct Conversion X-Ray Detection", IEEE vol. 52, 2037(2005)). Unfortunately, the PbO layers manufactured using conventional deposition techniques were very porous. The film exhibited a rough surface morphology and composed of randomly oriented platelets several micron in diameter and a few hundred nanometers thick. The density of the grown layers was much lower than that of a crystalline material (up to 50% of single crystal density), which significantly decreases the X-ray attenuation of the grown film.

Furthermore, the grown PbO films are known to consist of two different crystallographic phases of PbO: the seeding layer, several microns thick, is formed by the yellow orthorhombic PbO with band gap of 2.7 eV, while the bulk of the layer grows as a red tetragonal lead oxide with band gap of 1.9 eV. The presence of an orthorhombic phase diminishes detector performance, and leads to the requirement of post-growth treatment of the PbO layer. In addition, the deposited films are unstable in air and known to degrade in the ambient environment.

In addition, PbO photoconductive layers have not yet shown adequate temporal behavior for fluoroscopic applications. The films are reported to exhibit significant image lag (the percentage of residual signal present in a subsequent frame), which precludes their use in real time imaging (i.e. dynamic imaging used in fluoroscopy) and restricts their application to static imaging only (radiology).

It therefore follows that the full potential of PbO remains unexploited in view of the aforementioned technical problems and limitations.

SUMMARY

PbO-based photoconductive X-ray imaging devices are disclosed in which the PbO photoconductive layer exhibits an amorphous crystal structure. According to selected embodiments, the amorphous PbO photoconductive layer may be formed by providing a substrate inside an evacuated evaporation chamber and evaporating lead oxide to deposit a photoconductive lead oxide layer onto the substrate, while subjecting the photoconductive layer to ion bombardment with oxygen ions having an ion energy between 25 and 100 eV. X-ray direct detection imaging devices incorporating such amorphous PbO photoconductive layers are shown to exhibit image lag that is suitable for fluoroscopic imaging.

Accordingly, in a first aspect, there is provided a method for fabricating a photoconductive device, the method comprising:

providing a substrate inside an evacuated evaporation chamber;

evaporating lead oxide to in the presence of oxygen gas to deposit a photoconductive lead oxide layer onto the substrate, while subjecting the photoconductive layer to ion bombardment with oxygen ions having an ion energy between 25 and 100 eV;

wherein an ion flux of the oxygen ions and a deposition rate of the lead oxide are selected such that the photoconductive lead oxide layer exhibits an amorphous crystal structure.

In another aspect, there is provided a direct conversion x-ray imaging device comprising a lead oxide photoconductive layer, wherein at least 20% of said lead oxide photoconductive layer exhibits an amorphous crystal structure, and a ratio of lead atoms to oxygen atoms between 0.8 and 1.2.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which:

FIGS. 9A and 9B show photographs of a poly-PbO sample and a glassy a-PbO sample, respectively.

DETAILED DESCRIPTION

Figure 1A:
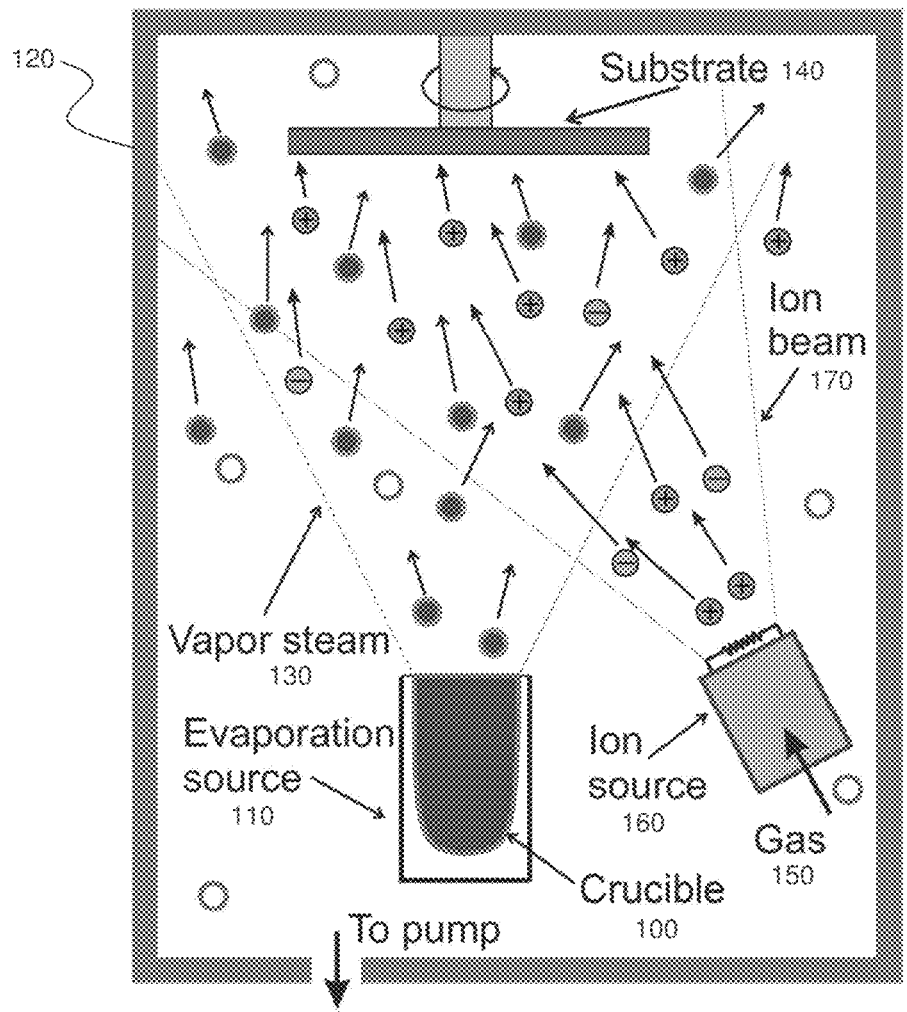
FIG. 1A illustrates an example system for fabricating a photoconductive a-PbO film.

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. Unless otherwise specified, the terms "about" and "approximately" mean plus or minus 25 percent or less.

It is to be understood that unless otherwise specified, any specified range or group is as a shorthand way of referring to each and every member of a range or group individually, as well as each and every possible sub-range or sub-group encompassed therein and similarly with respect to any sub-ranges or sub-groups therein. Unless otherwise specified, the present disclosure relates to and explicitly incorporates each and every specific member and combination of sub-ranges or sub-groups.

As used herein, the term "on the order of", when used in conjunction with a quantity or parameter, refers to a range spanning approximately one tenth to ten times the stated quantity or parameter.

As explained above, prior attempts by those skilled in the art to form PbO-based photoconductive direct detection X-ray devices have resulted in polycrystalline PbO (poly- PbO) photoconductive layers having high porosity, poor sample stability, surface roughness on a micron scale, low X-ray attenuation, and substantial image lag. In order to provide an improved material suitable for use in direct X-ray detection, the present inventors sought to develop a method for forming a structure with a higher density and a more uniform structure.

The present inventors initially recognized initial that an improved density and morphology could potentially be achieved by raising the substrate temperature during evaporative deposition. It was known in the art (see, for example, A. Anders "A structure zone diagram including plasma-based deposition and ion etching", Thin Solid Films 518, 4087-4090, 2010) that in order to achieve a denser structure during evaporative deposition, the homologous temperature $T_h$, defined by the ratio of the substrate temperature $T_{sub}$ (in Kelvin) to melting temperature $T_m$ should be approximately 0.6 or higher (the closer this ratio is to unity, a more refined structure is expected to be obtained). For example, a-Se has a melting temperature of 220° C. and it is conventionally deposited on a substrate at temperatures close to room temperature (e.g. ~60° C.). Such a substrate temperature provides a ratio of $T_h$=0.67, which, being above 0.6, results in a-Se layers formed have such a dense structure.

However, if $T_h$ is less than 0.6, the structure is expected to take on a less dense morphology, with high porosity occurring for $T_h$ values below about 0.3. Indeed, such low $T_h$ values have been associated with porous films composed of pillars or platelets, separated by voids. The conventional poly-PbO deposition methods known in the art involved deposition with a substrate temperature that was low relative to the PbO melting temperature, resulting in poly-PbO films that were composed of platelets and having very porosity (about 50% porosity).

The melting temperature of PbO is 890° C., and even if the substrate temperature is increased to 100° C., the aforementioned homologous temperature ratio $T_h$ is only slightly higher than 0.3, which is therefore not sufficiently high to create densely packed structure. According to the prescription of the homologous temperature ratio $T_h$ being greater than 0.6, it follows that this ratio should be about a factor of two higher, requiring a substrate temperature around 600° C. This constraint results in a significant dilemma, because such a high substrate temperature is not compatible with a-Si:H electronics that are commonly employed in detector substrates. The inventors therefore concluded that this approach was not practical for the fabrication of PbO flat panel X-ray imaging detectors.

In an effort to provide an alternative means to deposit additional energy into the growing PbO film during evaporative deposition, ion-assisted bombardment was performed using oxygen ions. Without intending to be limited by theory, it was believed that the energy of ionized gas would provide an effect similar to an elevated $T_h$ ratio, without overheating the substrate. It was believed that the energetic ions arriving at the surface of the growing layer would transfer their energy to the atoms on the surface via collisions and compresses the atoms within the film into denser structure, whereby the deposited energy would result in the enhancement of the surface atom mobility and allow the growth of a less porous structure and improve stoichiometry.

However, contrary to these expectations, it was found that under ion bombardment with controlled ion energy and deposition rate, the growing film underwent an unexpected phase change, resulting in a composition and structure that was not previously known in the art. Although the teachings of the prior art suggested that ion bombardment would result in a porous poly-PbO film with improved stoichiometry, the ion-assisted methods disclosed herein, under controlled conditions of oxygen ion bombardment, resulted in a glassy morphology that was characterized as amorphous PbO, with a stoichiometry characterized by a ratio of oxygen to lead close to unity (e.g. between 0.8 and 1.2).

This altered structure and composition was confirmed via experimental investigations that are detailed in the Examples section provided below. In brief, the PbO films grown according to the methods of the present disclosure were analyzed via Raman and XRD spectroscopy. The results of these investigations revealed that when PbO is grown according to the ion-assisted conditions described herein, the structure undergoes a phase transition from the polycrystalline phase to an amorphous phase. As described in detail below, this a-PbO material was found to have properties that address the aforementioned needs of direct-detection x-ray detectors, namely suitable gain and X-ray attenuation, while also exhibiting a sufficiently low image lag to be suitable for applications in fluoroscopy.

Accordingly, in one example embodiment of the present disclosure, a method is provided for forming a photoconductive layer comprising a-PbO. As illustrated in system diagram shown in FIG. 1A, and the flow chart provided in FIG. 1B, the a-PbO photoconductive layer is formed by an ion-assisted thermal evaporation method that employs an oxygen ion source during the thermal evaporative deposition process. The growth of an a-PbO photoconductive layer via evaporation during simultaneous ion bombardment by oxygen ions has been shown to result in a packed, dense and stable film of a-PbO.

FIG. 1A illustrates an example system for fabricating a photoconductive a-PbO film. A crucible 100, containing the PbO powder, is loaded into the furnace (evaporation source) 110 of the evaporation chamber 120. The furnace 110 heats up PbO powder to the evaporation temperature. The evaporated particles of PbO (vapor steam 130) condense on the rotating substrate 140. At the same time, oxygen gas 150 is supplied to the chamber through the ion source 160 that ionizes the gas. Energetic oxygen ions of ion beam 170 hit the growing layer of PbO, transfer their energy to the surface atoms, thus modifying the structure of the material.

Figure 1B:
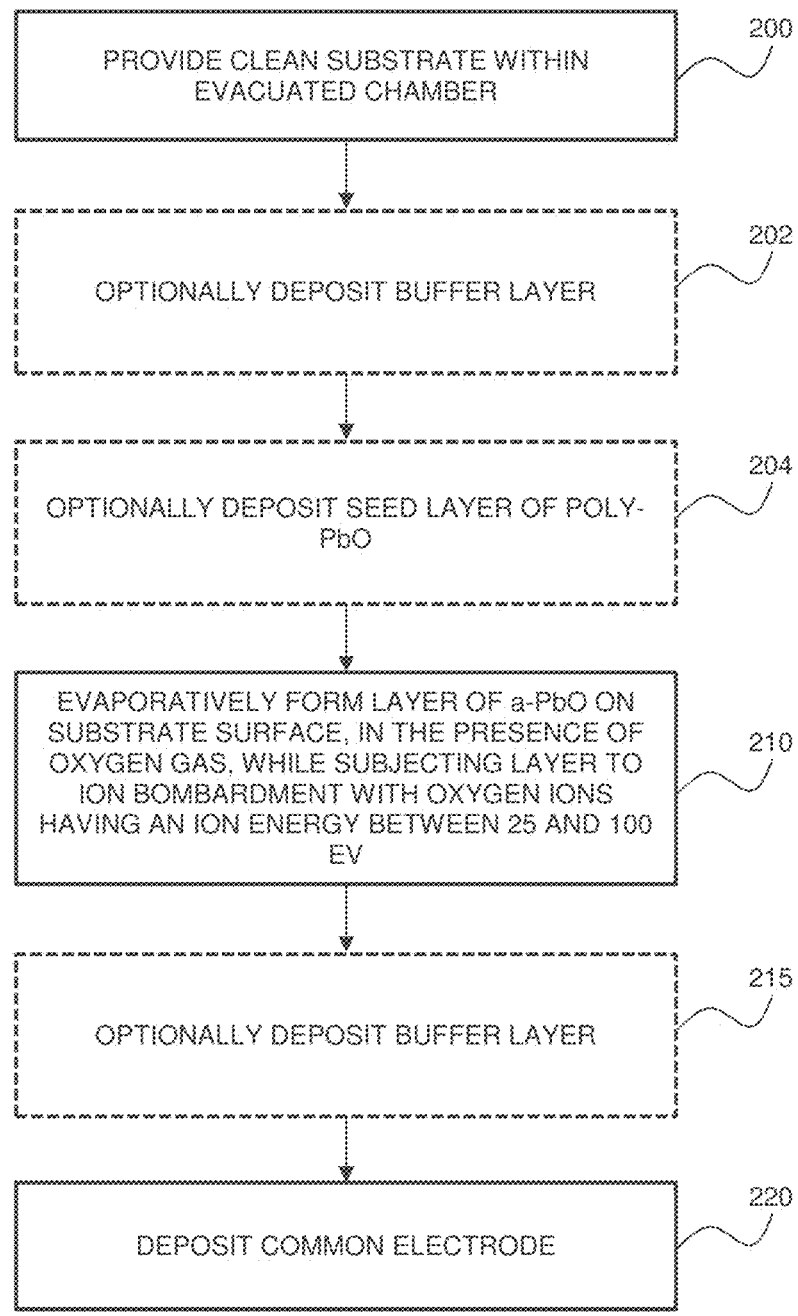
FIG. 1B illustrates an example flow chart for fabricating a photoconductive a-PbO film.

Referring now to step 200 in FIG. 1B, a clean substrate is placed inside an evacuated evaporation chamber. The substrate may include an array of electrodes defining pixels of an imaging device. For example, the substrate may be a TFT substrate (e.g. a silicon substrate) having electronic components (such as transistors and capacitors) integrated therein.

The substrate surface may be cleaned via plasma cleaning prior to the deposition (this step may be performed immediately prior to deposition, in order to ensure a clean surface). At step 210, lead oxide, provided in a crucible within the chamber, is evaporatively deposited to form a layer of a-PbO on the substrate surface, where the layer is formed in the presence of oxygen gas, while being subjecting to ion bombardment with oxygen ions having an ion energy between 25 and 100 eV. According to various example implementations, the deposition rate may be controlled to lie within the range of 10-200 A/s.

A common electrode may then be deposited onto the a-PbO photoconductive layer, as per step 220. FIG. 1B also shows several optional steps involving the formation of seed and buffer layers, and these steps are described in further detail below.

According to the present example embodiment, the lead oxide is evaporated and deposited in the presence of additional oxygen gas. During evaporation of PbO powder, a portion of the evaporated oxygen separates from lead and is pumped out from the vacuum chamber. In order to compensate for oxygen deficiency, the evaporation of PbO occurs in the presence of molecular oxygen. It is believed that the molecular oxygen does not incorporate well with lead during film formation, because $O_2$ is a stable molecule and needs to be split in to oxygen atoms. This process is not very efficient, since there are no precursors for it. The additional molecular oxygen helps to improve the stoichiometry, but does not solve the problem completely. In the absence of film bombardment with oxygen ions, the film is still porous, has lag, unstable in air and exhibits oxygen deficit.

On the other hand, when the oxygen is ionized in the ion source, $O^+$ ions (atomic oxygen) are produced that are more prone to incorporation with lead. This results in much more effective oxidation process and solves the problem of oxygen deficiency. Moreover, oxygen ions, arriving at the surface of the growing film, have higher energy than the $O_2$ molecules are used for structure modification.

During the formation of the photoconductive a-PbO layer, several parameters may be controlled in order to produce a layer (e.g. film or coating) that includes an amorphous composition. These parameters include the deposition rate of the PbO and the ion flux (e.g. via the gas flow rate). The control of these parameters enables the formation and growth of a layer having an amorphous crystal structure.

As described above, the simultaneous bombardment of the growing film of PbO delivers additional energy to the firm. This delivery of energy, relative to the number of atoms in the layer, is controlled or determined, at least in part, by the following three parameters: energy of the ions, ion current density (ion flux) and the deposition rate of the PbO layer. They parameters are related as follows:

Energy Dose per Atom=(Ion energy*Flux)/Deposition rate

Thus, for example, if the energy of a single 100 eV ion is delivered to 10 deposited atoms (i.e. 10 atoms in the PbO layer), then each atom will receive an average dose of 10 eV.

Although the same energy dose could be delivered by 10 ions of 10 eV each, it has been found that the amorphous structure is best formed if the required energy dose is delivered by ions having an energy in the range of 25-100 eV. For example, if lower energy ions (e.g. 10 eV ions), are delivered, they cannot provide same result, even at a high flux, since this ion energy is not sufficient to produce a modification in crystal structure to the amorphous phase. On the other hand, ions having substantially higher energy, such as 1000 eV/ion, have high probability in film sputtering, rather than promoting amorphous film growth. It therefore follows that ions having an energy in an intermediate range are suitable for achieving a change in crystal structure while enabling continued film growth. Suitable ranges may include, for example, any one of more of the following: 25-100 eV, 60-90 eV, 50-100 eV, 10-100 eV, 10-200 eV, 50-200 eV, and 20-150 eV.

According to one example embodiment of the present disclosure, when the ion energy is constrained as described above, the ion current density (flux) and the deposition rate are controlled in order to provide a total dose of 1-10 eV/atom (i.e. per atom of the layer that is formed during bombardment). In other example embodiments, the ion current density and deposition rate may be selected to achieve a total dose ranging from 1-20, 5-15, 5-20, 1-15 eV/atom.

In one example implementation, the deposition rate and oxygen flow are approximately 20 A/s and 20 sccm, respectively. However, it will be understood that these deposition parameters are scalable: for higher deposition rate, a higher oxygen flow is needed, and vice versa. Thus, the oxygen flow rate may be determined by the deposition rate. In some example embodiments, the deposition rate can be in a range from 10 A/s to 200 A/s, while an example range for the oxygen flow rate is 5-60 sccm.

The aforementioned parameters may be controlled in order to achieve a desired level of stoichiometry and/or a desired fraction (by weight or volume) of amorphous crystal structure. For example, the ion energy, ion flux, and deposition rate may be controlled to obtain a photoconductive layer having a porosity of less than 50%, less than 40%, less than 30%, less than 20%, less than 10%, less than 7%, and less than 5%. Similarly, for example, the ion energy, ion flux, and deposition rate may be controlled to obtain a volume fraction of PbO in the amorphous phase that is greater than 10%, greater than 20%, greater than 25%, greater than 30%, greater than 40%, greater than 50%, greater than 60%, greater than 70%, greater than 80%, greater than 90%, and greater than 95%. The suitable parameters for achieving these properties may be determined, for example, through a series of controlled experiments in which the aforementioned parameters are varied and the resulting film properties are experimentally measured.

In one example implementation, the preceding example method may be performed with the substrate temperature maintained under a temperature that is compatible with electrical components integrated into the substrate. In one example implementation, the maximum substrate temperature is less that a maximum temperature compatible with a-Si TFT electronics, such as approximately 220-240° C. According to various non-limiting example implementations, the substrate temperature may be maintained below an upper temperature of 300° C., 280° C., 260° C., 240° C., 220° C., 200° C., 180° C., 160° C., 140° C., 120° C., or 100° C. It will be understood that a suitable maximum substrate temperature may depend on the substrate material and configuration.

In some embodiments, thermal annealing of an a-PbO film may be employed to refine the crystal structure and to release any stress/strain in the film or at the interface. The annealed films may have higher charge yield and lower dark current relative to un-annealed films. According to various example implementations, annealing can take place in the atmosphere of oxygen, noble gasses, as well as in vacuum. Annealing in an oxygen atmosphere may lead to over-oxidation of the grown layer, thus the selection of annealing gas may be selectively chosen for specific applications.

While some implementations of the aforementioned fabrication methods employ oxygen as a working gas, it will be understood that alternative implementations may employ one or more other working gases. For example, a mixture of oxygen and argon may be employed as working gasses, which may be supplied to the ion source. In other alternative implementations, one or more other noble gasses, such as nitrogen, krypton and xenon may be employed in addition, or an alternative, to argon. Gas may optionally be supplied directly to the chamber, as opposed to though the ion source, thereby providing a source of background gas. Such a background gas may be oxygen, or gas mixtures such as those described above.

Figure 2:
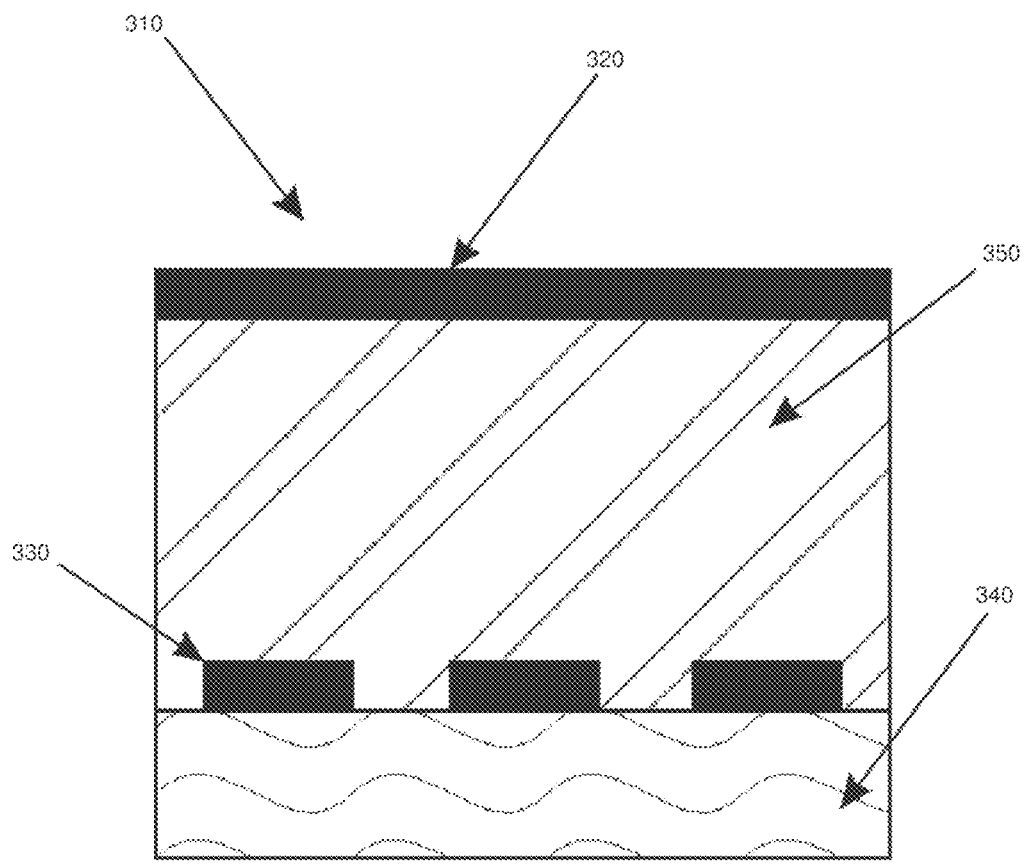
FIG. 2 shows a thin film structure of an amorphous PbO (a-PbO) X-ray image sensor, in cross-sectional view.

Referring now to FIG. 2, an example photoconductive a-PbO detector is shown. The detector 310 includes a substrate 340 with pixelated signal electrodes 330. The pixelated signal electrodes may define, for example, pixels of a flat panel imaging device. The electrodes 330 may be formed from a material with a similar work function to PbO, such as indium tin oxide (ITO) or aluminum.

The substrate may, for example, include integrated electronic components for signal processing. For example, the substrate may be a TFT substrate (e.g. a silicon substrate) having electronic components integrated therein.

The photoconductive a-PbO layer 350 is formed over the signal electrodes 330. The thickness of the a-PbO layer may vary depending on the application. A non-limiting example thickness range for the a-PbO layer is 20-300 μm. The common electrode 320 is formed on the a-PbO layer 350. According to a non-limiting example implementation, the common electrode 320 may be formed from a transparent electrode material, such as ITO, or a metallic electrode such as gold. The thickness of the common electrode may be selected to be less than approximately 1 micron, in order to reduce cost and provide suitable X-ray transparency.

Figure 3:
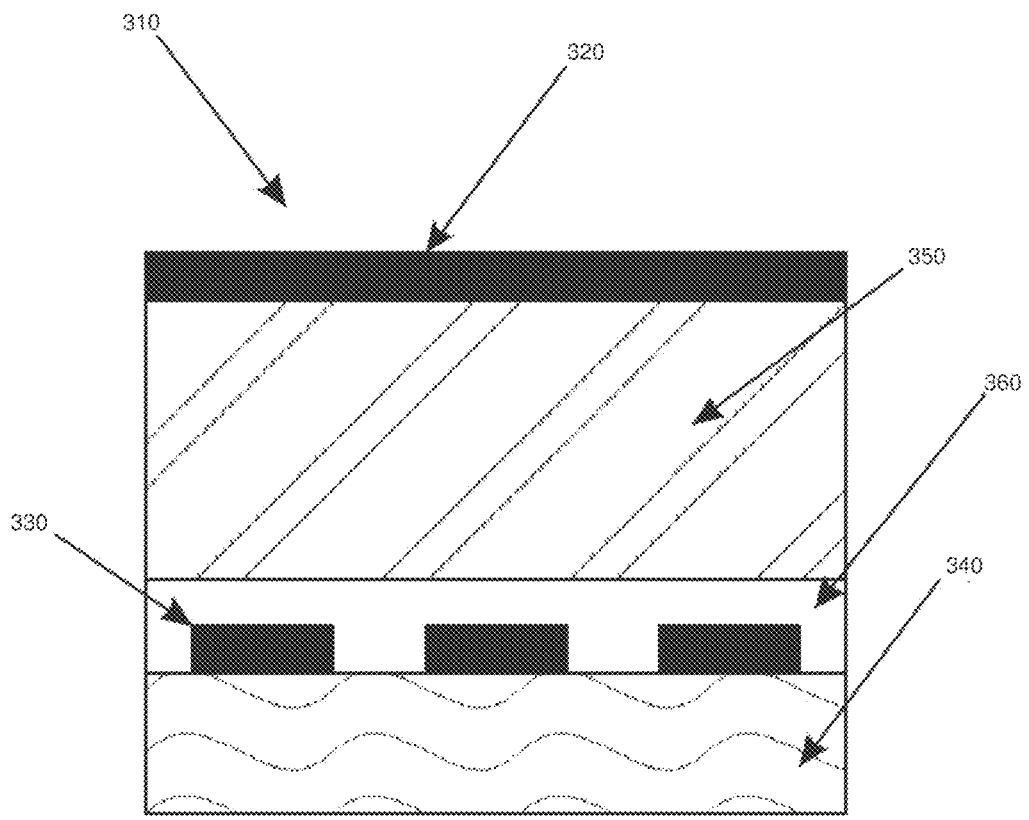
FIG. 3 shows a thin film structure of an a-PbO X-ray image sensor with a seeding layer of poly-PbO, in cross-sectional view.

FIG. 3 shows an alternative example embodiment in which a polycrystalline PbO seed layer 360 is provided on the pixelated signal electrodes 330, such that the a-PbO layer is formed on the seed layer 360. The optional inclusion of the seed layer 360 is shown in step 204 of the flow chart shown in FIG. 1B. The seed layer may be formed as a thin poly-Pb1Ox (where x is preferably 1, but may lie within the range of 0.8-1.2) layer with a thickness in the range of 0.2 μm to 5 μm. Such a configuration protects the substrate, for example flat panel imager, from possible etching by energetic ionized oxygen atoms.

Figure 4:
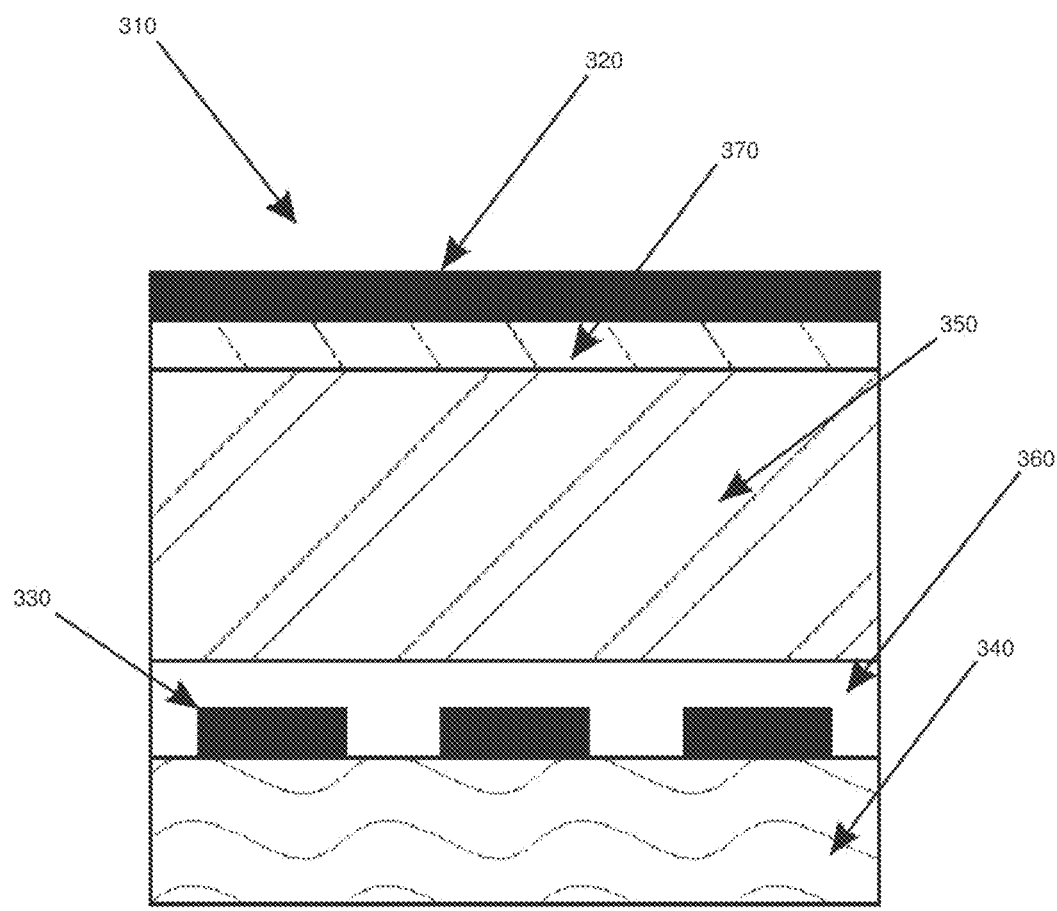
FIG. 4 shows a thin film structure of an a-PbO X-ray image sensor with the seeding layer and a buffer layer, in cross-sectional view.

Referring now to FIG. 4, an alternative example embodiment is shown in which one or more buffer layers 370 are included between the a-PbO layer 350 and the common electrode 320. The buffer layer 370 is an electrically resistive layer. The electrical resistance of the buffer layer and its thickness are arranged such that when an electrical bias potential is applied, the voltage drops within the a-PbO layer 350 rather than within the buffer layer 370, i.e. the resistance of buffer layer 370 is less than that of the a-PbO layer 350. The optional inclusion of the buffer layer 370 is shown in step 215 of the flow chart shown in FIG. 1B.

The properties of the buffer layer 370 are selected to suppress charge injection from the electrodes into the photoconductive a-PbO layer 350. Upon application of a bias potential, charge carriers are injected from the conducting electrodes into the buffer layers, where they are trapped. This injection process is self-regulating in that the trapped charges in the buffer layers will reduce the field across the a-PbO-electrode interfaces, thereby preventing further injection of dark carriers. The buffer layer 370 also allows X-ray generated charge carriers to exit the a-PbO layer 350 without accumulation at the interface.

In some non-limiting example implementations, the buffer layer 370 may be composed of a polymer, such as cellulose acetate (CA), or a semiconducting/semi-insulating material, for example $As_2Se_3$, $CeO_2$, Se doped with As, Cl or similar materials (e.g. heavily doped with trapping centers for electrons). In some example implementations, the thickness of the buffer layer may be between 0.5-1 μm (cellulose acetate), between 0.2-1 μm, or between 0.05-1 μm. For example, it has been shown that the application of a thin (0.8 μm) CA layer as a buffer layer can be effective in eliminating or reducing signal lag. In another example, $As_2Se_3$ has a band gap similar to that of PbO but it contains a large number of electron traps which when filled, form a negative space-charge barrier thus stopping injection of electrons from the cathode, while allowing holes to flow freely through a-PbO-$As_2Se_3$ interface.

The buffer layer 370 may also be used to prevent any chemical reactions of the photoconductive PbO layer 350 with air or with electrode material.

Figure 5:
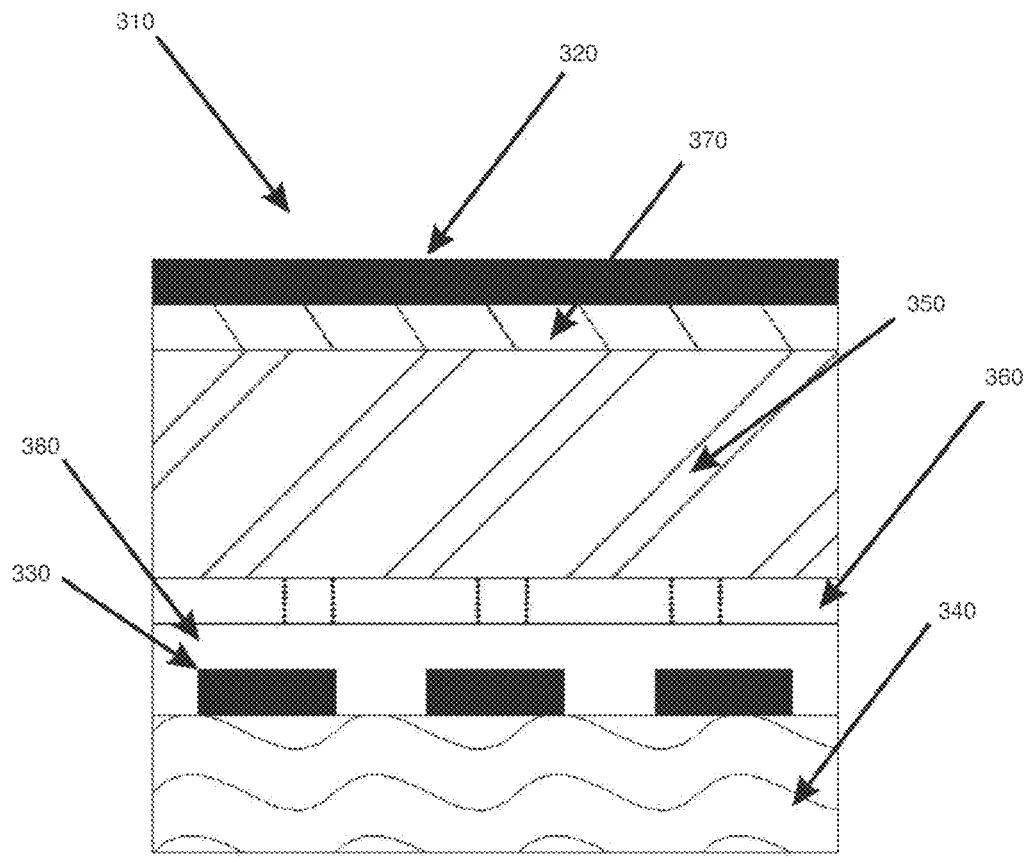
FIG. 5 shows a thin film structure of an a-PbO X-ray image sensor with the seeding layer and two buffer layers, in cross-sectional view.

FIG. 5 shows yet another example embodiment in which a buffer layers 370 and 380 are provided on both sides of photoconductive layer 350, where the second buffer layer 380 is formed over the pixelated signal electrodes 330, and the seeding layer 360 resides between the second buffer layer 380 and the photoconductive a-PbO layer 350. In another example implementation (not shown), the device may be formed without the first buffer layer 370, but with the second buffer layer 380. The optional inclusion of the buffer layer 380 is shown in step 202 of the flow chart shown in FIG. 1B.

As demonstrated in the examples below, a-PbO X-ray imaging devices fabricated according to the embodiments described herein have been shown to exhibit improved image lag relative to poly-PbO based X-ray imaging devices, with image lag that is sufficiently low to be suitable for fluoroscopy applications. Image lag is a memory effect where information from previous images is retained during next captures. Accordingly, as used herein, the phrase "image lag" refers to the percentage of signal present in a frame following the frame in which it was generated. In some example embodiments, the properties of the a-PbO photoconductive layer (and optional buffer layers) are selected such that the image lag is less than 20%, less than 15%, less than 10, or less than 5%, for a frame rate of 30 FPS or less. In other example embodiments, the properties of the a-PbO photoconductive layer (and optional buffer layers) are selected such that the image lag is less than 20%, less than 15%, less than 10, or less than 5%, for a frame rate of 24 FPS or less. It will be understood that frame rate may depend on the application or medical procedure. For example, for gastrointestinal voiding cystourethrogram (GI/VCUG) studies, images are typically acquired at 5 fps, while during Barium swallow examination, images are typically acquired at frame rates of 7.5-15 fps. During fluoroscopically guided cardiac catheterization and similar procedures, images are typically acquired at 30 fps. The rate of 30 fps allows for imaging of fast moving organs (such as the heart).

EXAMPLES

The following examples are presented to enable those skilled in the art to understand and to practice embodiments of the present disclosure. They should not be considered as a limitation on the scope of the disclosure, but merely as being illustrative and representative thereof.

Example 1

Morphology of a-PbO Material

The 'glassy PbO' described herein readily visually distinguishable from previously used polycrystalline PbO conversion layers due to its specific amorphous morphology, color and visual impression. For example, FIG. 9A shows a photograph of a poly-PbO sample, for which the small round circle in the center is a top gold contact, and FIG. 9B shows a glassy a-PbO sample (two small round circles on the sample are top gold contact), having a completely different color and morphology.

Additional structural analysis (Raman, XRD) is able to differentiate between the different modifications of PbO, as shown in the Example provided below.

Example 2

Experimental Characterization of a-PbO Material

Figure 6A:
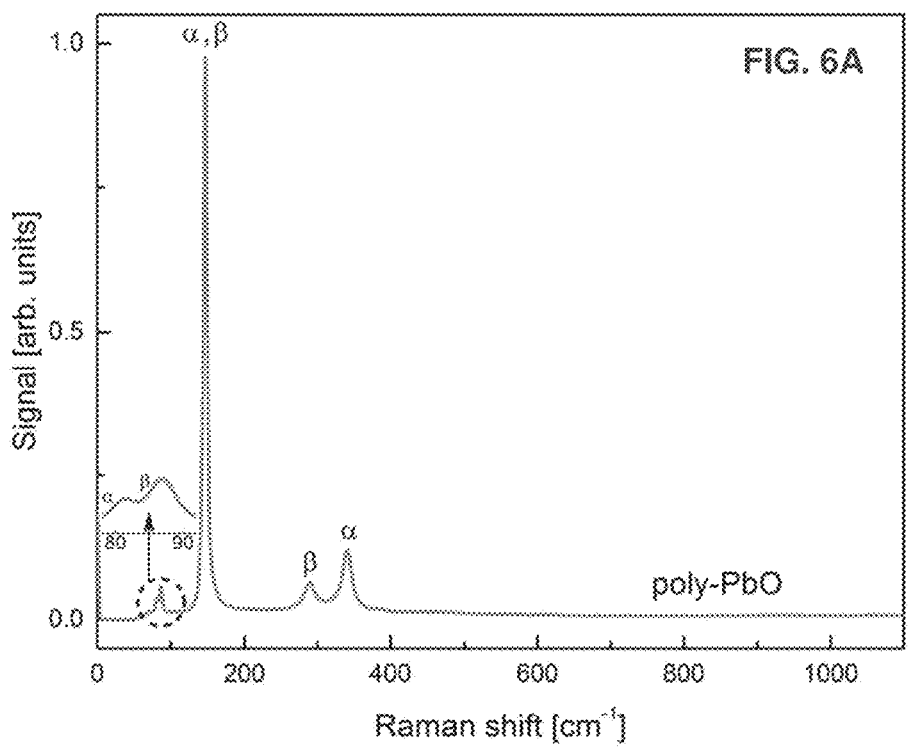
FIGS. 6A and 6B plots the results from Raman spectroscopy measurements of a poly-PbO film (6A) and an a-PbO film (6B).
Figure 6B:
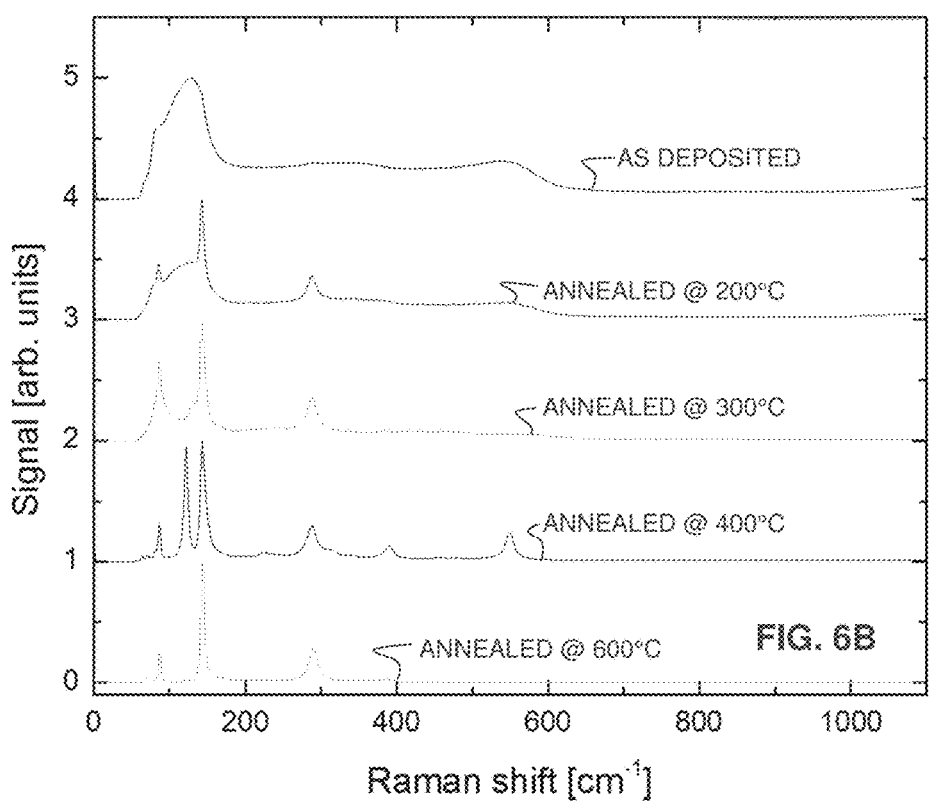

Amorphous films were fabricated at a deposition rate of 20 A/s, an oxygen flow of about 20 sccm and ion energy in a range of 60-90 eV. The Raman spectra shown in FIGS. 6A and 6B were taken with Renishaw spectrometer model inVia 304N77. All spectra were taken with 785 nm wavelength laser and 1200 Ip/mm mesh.

The Raman spectrum of poly-PbO (shown in FIG. 6A) indicates the presence of both phases: tetragonal α-PbO peaks at 81 and 340 cm−1 and β-PbO peaks at 89 and 289 cm−1. The Raman peak at ~146 cm−1 cannot be unambiguously attributed to either phase, since both of them have the strongest signal in this region: α-PbO at 145 cm−1 and β-PbO at 147 cm−1. On the other hand, the Raman spectrum of as grown glassy PbO (shown in FIG. 6B) is very different: it is represented by a wide peaks and a plateau indicating amorphous structure. Upon annealing, the characteristic peaks start to appear from a broad spectrum. At 200° C., the peaks at 85, 143 and 288 cm$^{-1}$ start to be distinguishable and at 300° C., they become well defined. These peaks are attributed to β-PbO phase. At 400° C., another characteristic β-PbO peaks appears at 71 cm$^{-1}$, as well as additional peak at 121, 224, 391 and 548 cm$^{-1}$ attributed to $Pb_3O_4$. Upon 600° C. annealing, most of the former peaks have disappeared. All peaks at 600° C. annealing temperature are attributed to orthorhombic PbO.

Figure 7A:
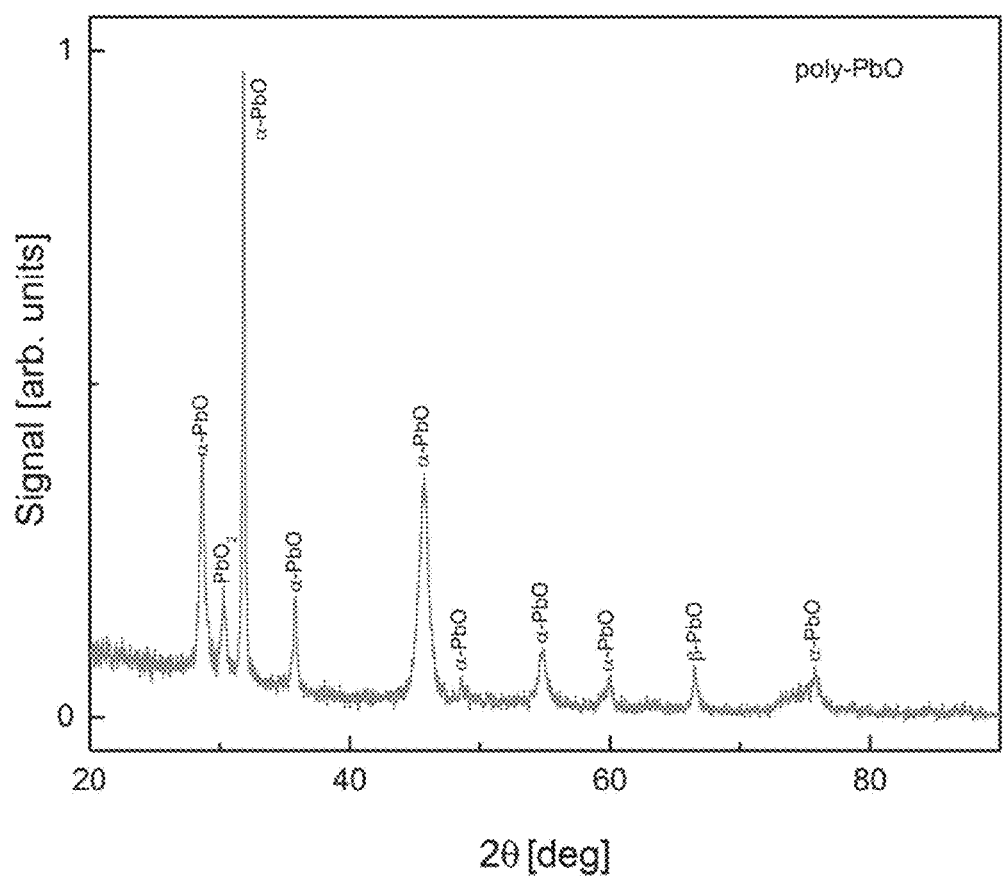
FIGS. 7A and 7B plots the results from XDR spectroscopy measurements of poly-PbO and a-PbO films, respectively.

The XRD spectra of poly and a-PbO are shown in FIGS. 7A and B. The typical x-ray diffraction pattern were recorded from 2θ=20° to 90° with Pananalytical Expert Pro Diffractometer. The phase identification was achieved by the comparison with data from the JCPDS International diffraction data base.

Figure 7B:
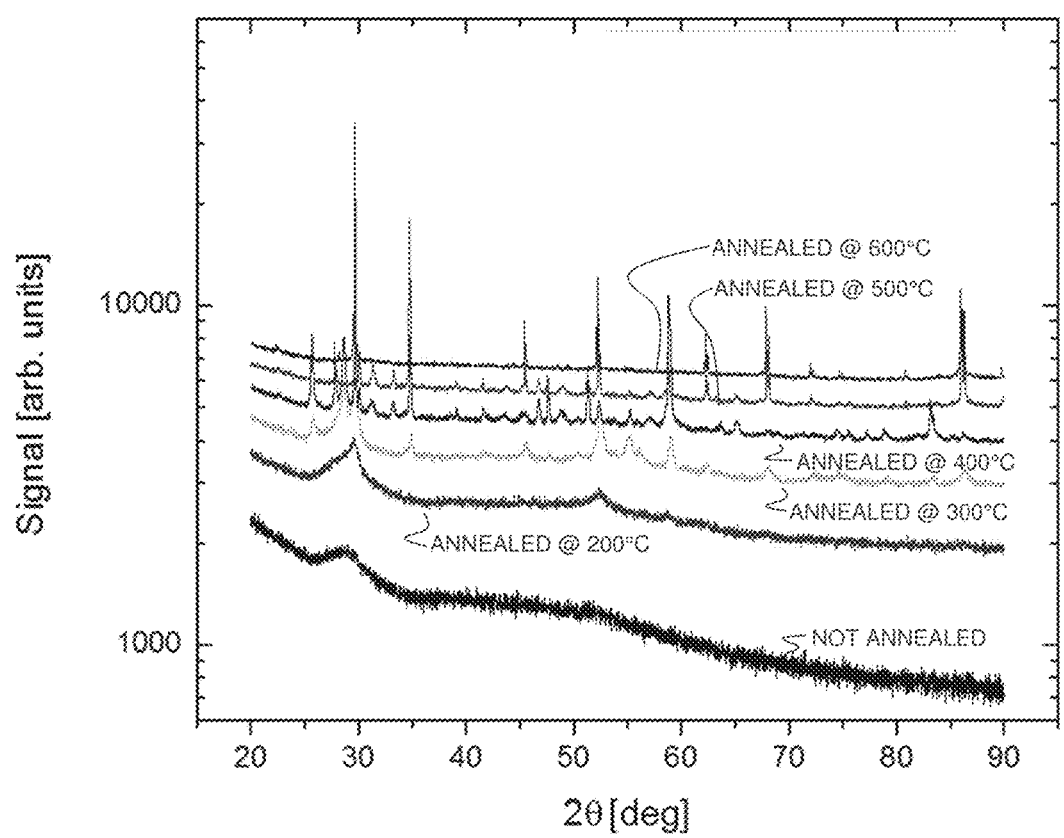

The polycrystalline film shows sharp characteristic peaks indicative of crystalline, ordered structure, while spectra of as grown glassy PbO does not have distinct narrow peaks, indicative for amorphous structure. The amorphous samples were annealed under protective Ar gas atmosphere for 1 hour at temperatures between 200 and 600° C. FIG. 7B shows XRD patterns of as deposited (not annealed) and annealed amorphous samples. Annealing up to 200° C. resulted in insignificant change in the structure. At higher temperatures a gradual refinement of the crystal structure is observed i.e. the half width of the peaks decreases and the intensity of the peaks increases with increasing the temperature. At temperatures in excess of 300° C., multiple phases of PbO were found to coexist simultaneously. However at 600° C., the spectrum closely resembling a single phase of orthorhombic PbO with a minor peak of $PbO_2$ detected.

Figure 8:
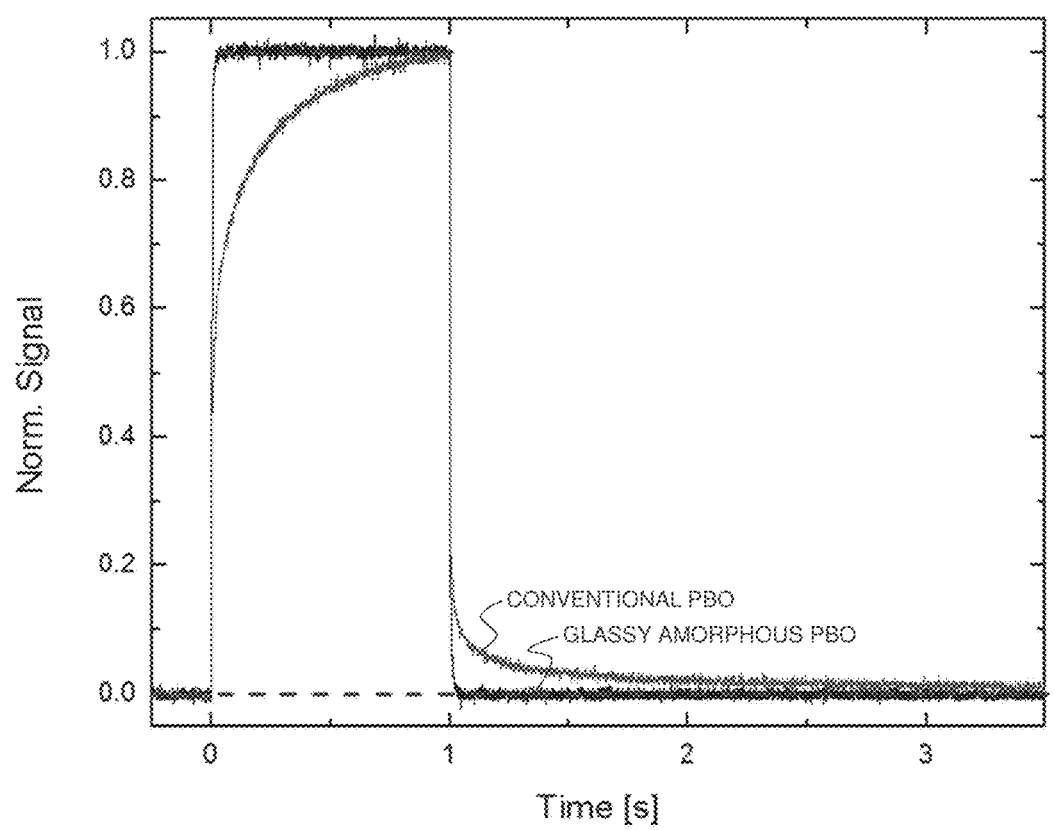
FIG. 8 plots the temporal response of poly-PbO and a-PbO films, demonstrating the low image lag capability of the a-PbO film.

The X-ray responses of the poly- and glassy PbO specimens are shown in FIG. 8. A standard medical X-ray tube provided X-rays pulse of 60 kVp. The pulse duration was limited to 1 s. An external power supply maintained the desired voltage drop across the sample and the signal current induced by the X-ray pulse in PbO layers was observed on the 150 MHz bandwidth digital oscilloscope Tektronix model TDS 420.

As seen the amplitude of the signal of poly-PbO sample grows during the X-ray pulse and does not drop down to a base line immediately at the end of exposure and thus exhibits lag. In contrast the amplitude of the glassy PbO signal is constant during the pulse and shows no lag at the end of exposure.

Example 3

Stability of a-PbO Material

As noted above, the a-PbO films formed according to the methods described herein have been found to exhibit higher stability than poly-PbO films. Poly-PbO is known to degrade under ambient conditions. It transforms into hydro cerussite under exposure to air. As a result a strong characteristic Raman peak at 1050 cm$^{-1}$ appears. In order to prevent this process, the poly-PbO samples were stored and measured under protective atmosphere of $N_2$. Glassy amorphous PbO samples were found to be not sensitive to air, and a hydro cerussite peak was not observed, even after a month of storage at ambient conditions.

Figure 10:
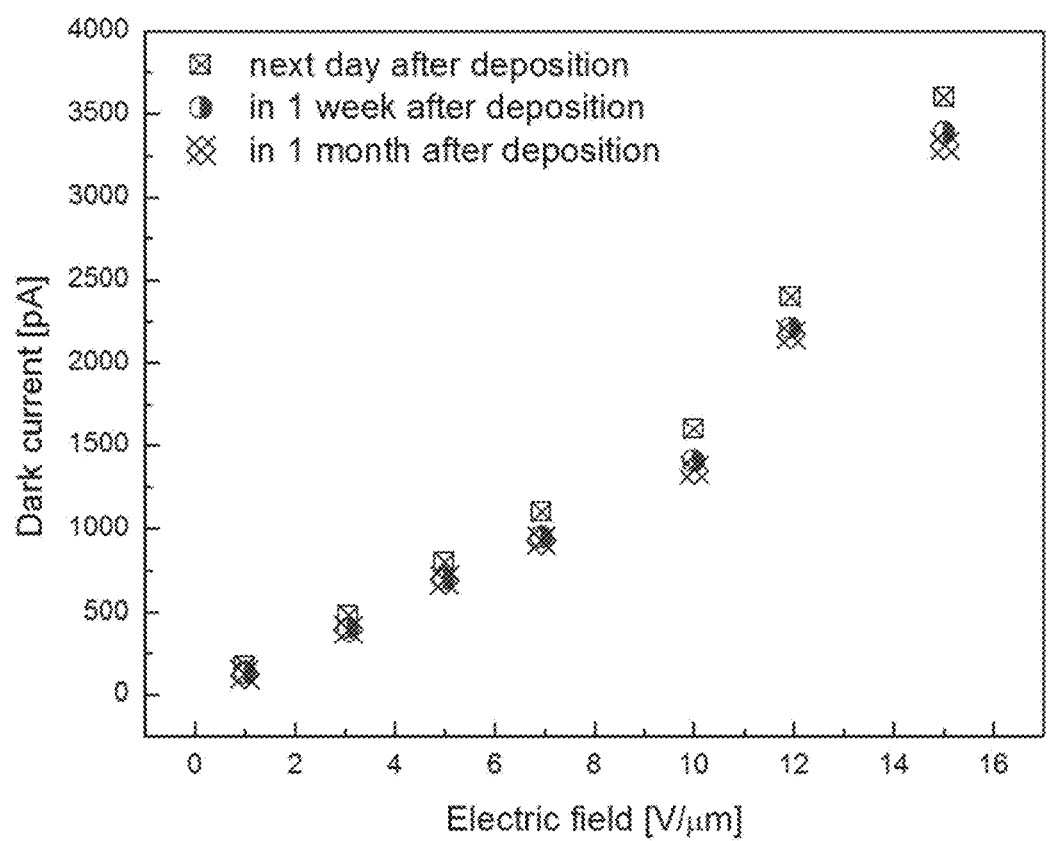
FIG. 10 plots the dependence of the dark current of a-PbO films on electric field at a number of different times post-deposition.

During the degradation process that is known to occur when poly-PbO is exposed to ambient conditions, the dark current (current flowing through the materials when it is not exposed to light or x-rays) increases. The process is very fast. Within an hour, large changes in the dark current are observable. In contrast, as shown in FIG. 10, dark current measurements on the a-PbO samples did not show any significant changes, thus demonstrating the long-term stability of the a-PbO films.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

Therefore what is claimed is:

1. A method of forming a photoconductive x-ray imaging device, the method comprising deposition of a photoconductive layer onto a substrate having one or more electrodes defined thereon, wherein the deposition of the photoconductive layer is performed with deposition conditions according to steps comprising:
   providing the substrate inside an evacuated evaporation chamber;
   evaporating lead oxide in the presence of oxygen gas to deposit a photoconductive lead oxide layer onto the substrate while subjecting the photoconductive layer to ion bombardment with oxygen ions having an ion energy between 25 and 100 eV, such that the lead oxide layer exhibits photoconductivity in response to x-ray absorption;
   wherein an ion flux of the oxygen ions and a deposition rate of the lead oxide are selected such that the photoconductive lead oxide layer is formed with an amorphous structure, in contrast to a polycrystalline structure that would be formed in the absence of the oxygen ion bombardment; and
   wherein the amorphous structure is formed according to the deposition conditions such that the photoconductive x-ray imaging device exhibits an image lag of less than 10% for frame rates less than or equal to 30 frames per second.

2. The method according to claim 1 wherein the ion flux of the oxygen ions and the deposition rate of the lead oxide are selected such that an average energy dose delivered by the oxygen ions per atom of the photoconductive layer is between 1 eV and 10 eV.

3. The method according to claim 1 wherein the ion energy of the oxygen ions is between 60 eV and 90 eV.

4. The method according to claim 1 wherein the deposition rate is within the range of 10-200 Angstroms/s.

5. The method according to claim 1 wherein a flow rate of the oxygen gas is within the range of 5-60 sccm.

6. The method according to claim 1 wherein at least one of the ion energy, the ion flux, and the deposition rate is controlled such that a volume fraction of at least 20% of the photoconductive layer exhibits the amorphous structure and a ratio of oxygen to lead between 0.8 and 1.2.

7. The method according to claim 1 wherein at least one of the ion energy, the ion flux, and the deposition rate is controlled such that a volume fraction of the photoconductive layer exhibiting the amorphous structure exceeds 20%.

8. The method according to claim 1 wherein at least one of the ion energy, the ion flux, and the deposition rate is controlled such that a porosity of the photoconductive layer is less than 40%.

9. The method according to claim 1 wherein at least one of the ion energy, the ion flux, and the deposition rate is controlled such that a porosity of the photoconductive layer is less than 10%.

10. The method according to claim 1 wherein the substrate has an array of electrodes formed thereon prior to the deposition of the photoconductive lead oxide layer, the method further comprising:

depositing a common electrode after forming the photoconductive layer.

11. The method according to claim 10 further comprising, prior to the deposition of the photoconductive layer, forming a seed layer of polycrystalline PbO over the array of electrodes.

12. The method according to claim 11 wherein the seed layer has a thickness between 0.2 microns and 5 microns.

13. The method according to claim 10 further comprising, prior to depositing the common electrode, forming a buffer layer over the photoconductive layer, wherein the buffer layer is configured to suppress charge injection from the common electrode when a bias voltage is applied between the common electrode and an electrode of the array of electrodes.

14. The method according to claim 13 wherein the buffer layer has a thickness between 0.05 microns and 1 micron.

15. The method according to claim 1 wherein a temperature of the substrate is maintained below 220 degrees Celsius during the deposition of the lead oxide photoconductive layer.

16. The method according to claim 1 wherein a temperature of the substrate is maintained below a temperature of 200 degrees Celsius during the deposition of the lead oxide photoconductive layer.

17. The method according to claim 1 wherein a thickness of the photoconductive layer is between 20 microns and 300 microns.

18. The method according to claim 1 further comprising thermally annealing the lead oxide photoconductive layer.

* * * * *